United States Patent
Kawashima (10) Patent No.: US 11,942,163 B2
(45) Date of Patent: Mar. 26, 2024

(54) NEURAL NETWORK CIRCUIT COMPRISING NONVOLATILE MEMORY CELLS AND REFERENCE-CURRENT CELLS

(71) Applicant: RENESAS ELECTRONICS CORPORATION, Tokyo (JP)

(72) Inventor: Yoshiyuki Kawashima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/502,832

(22) Filed: Oct. 15, 2021

(65) Prior Publication Data

US 2022/0148662 A1 May 12, 2022

(30) Foreign Application Priority Data

Nov. 10, 2020 (JP) ................. 2020-186942

(51) Int. Cl.

| | | |
|---|---|---|
| G11C 16/28 | (2006.01) | |
| G06N 3/063 | (2023.01) | |
| G11C 11/54 | (2006.01) | |
| G11C 16/04 | (2006.01) | |
| G11C 16/10 | (2006.01) | |
| G11C 16/16 | (2006.01) | |

(Continued)

(52) U.S. Cl.
CPC ............. *G11C 16/28* (2013.01); *G06N 3/063* (2013.01); *G11C 11/54* (2013.01);
(Continued)

(58) Field of Classification Search
CPC ..... G11C 16/28; G11C 16/26; G11C 16/0466; G11C 11/54; G11C 16/10; G11C 16/14;
(Continued)

(56) References Cited

U.S. PATENT DOCUMENTS

| | | | |
|---|---|---|---|
| 5,091,888 A | 2/1992 | Akaogi | |
| 7,043,466 B2 * | 5/2006 | Watanabe | G06N 3/063 706/26 |

(Continued)

FOREIGN PATENT DOCUMENTS

| | | |
|---|---|---|
| JP | 062-080899 A | 4/1987 |
| JP | 03-046197 A | 2/1991 |

(Continued)

OTHER PUBLICATIONS

Notice of Reasons for Refusal dated Dec. 26, 2023 issued in the corresponding Japanese Patent Application No. 2020-186942, with English machine translation.

*Primary Examiner* — Kretelia Graham
(74) *Attorney, Agent, or Firm* — Rimon P.C.

(57) ABSTRACT

In a case of achievement of a neural network circuit using a plurality of nonvolatile memory cells, a technique capable of accurately reading information recorded in the plurality of nonvolatile memory cells is provided. A semiconductor device includes: a plurality of nonvolatile memory cells; a plurality of reference-current cells; and a sense amplifier comparing an electric current flowing in each of the plurality of nonvolatile memory cells and an electric current flowing in each of the plurality of reference-current cells. In this case, each cross-sectional structure of the plurality of reference-current cells is the same as each cross-sectional structure of the plurality of nonvolatile memory cells. The writing operation or the erasing operation is also performed to each of the plurality of reference-current memory cells when the writing operation or the erasing operation is performed to each of the plurality of nonvolatile memory cells.

6 Claims, 10 Drawing Sheets

(51) Int. Cl.
  *H01L 29/423* (2006.01)
  *H01L 29/792* (2006.01)
(52) U.S. Cl.
  CPC .......... *G11C 16/0466* (2013.01); *G11C 16/10* (2013.01); *G11C 16/16* (2013.01); *H01L 29/4234* (2013.01); *H01L 29/792* (2013.01)
(58) Field of Classification Search
  CPC ....... G11C 16/16; G11C 7/14; G11C 11/4099; G11C 2211/5634; G06N 3/063; H01L 29/4234; H01L 29/792
  See application file for complete search history.

(56) References Cited

U.S. PATENT DOCUMENTS

| | | | |
|---|---|---|---|
| 7,206,241 B2* | 4/2007 | Kido | G11C 16/0483 |
| | | | 365/210.1 |
| 7,349,250 B2 | 3/2008 | Ito et al. | |
| 7,682,990 B2* | 3/2010 | Hamamura | H01L 29/40117 |
| | | | 257/E21.267 |
| 2014/0008716 A1 | 1/2014 | Arigane et al. | |
| 2018/0204847 A1* | 7/2018 | Katou | H01L 29/66833 |
| 2018/0335973 A1 | 11/2018 | Sato et al. | |
| 2020/0111902 A1* | 4/2020 | Uchimura | H01L 29/42344 |

FOREIGN PATENT DOCUMENTS

| | | |
|---|---|---|
| JP | 2006-100531 A | 4/2006 |
| JP | 2014-017343 A | 1/2014 |
| JP | 2018-195285 A | 12/2018 |
| JP | 2019-517138 A | 6/2019 |
| WO | 2017/200883 A1 | 11/2017 |

* cited by examiner

$$C = \frac{1}{2}\sum_{i=1}^{N}(y_i - t_i)^2 \begin{cases} y_1 = a(w_1x_1 + w_2x_2 + ...) \\ y_2 = ... \\ \vdots \\ y_N = ... \end{cases}$$

w: WEIGHT
x: INPUT
a: COEFFICIENT

|  | Vmg [V] | Vs [V] | Vcg [V] | Vd [V] |
|---|---|---|---|---|
| ERASING | −1〜−6.5 | 4.5〜6.5 | 0 | 1.5 |
| WRITING | 2〜10 | 4.5〜6.5 | 1.5 | 0.5 |
| READING | −5〜5 | 1.5 | 1.5 | 0 |

CHANGE OF ELECTRIC-CURRENT VALUE AFTER WRITING AND AFTER ERASING
(NUMBER OF TIMES OF REWRITINGS: SMALL)

CHANGE OF ELECTRIC-CURRENT VALUE AFTER WRITING AND AFTER ERASING
(NUMBER OF TIMES OF REWRITINGS: SMALL)

FIG. 14

CHANGE OF ELECTRIC-CURRENT VALUE AFTER WRITING AND AFTER ERASING
(NUMBER OF TIMES OF REWRITINGS: LARGE)

NEURAL NETWORK CIRCUIT
COMPRISING NONVOLATILE MEMORY
CELLS AND REFERENCE-CURRENT CELLS

CROSS-REFERENCE TO RELATED
APPLICATION

The disclosure of Japanese Patent Application No. 2020-186942 filed on Nov. 10, 2020, including the specification, drawings and abstract is incorporated herein by reference in its entirety.

BACKGROUND

The present invention relates to a semiconductor device, and relates to, for example, a semiconductor device including a plurality of nonvolatile memory cells.

In recent years, artificial intelligences have been dramatically developed, and popularization of various devices on which artificial intelligences are mounted has begun. There are a lot of methods for so-called machine learning of the artificial intelligences, and one of the methods is a method using a neural network. In the neural network, neuronal cells (neurons) in a human brain and a neural circuit network made of connections of the neuronal cells are expressed by a mathematical model that is called an artificial neuron.

There are disclosed techniques listed below.
[Patent Document 1] Japanese Unexamined Patent Application Publication No. 2018-195285
[Patent Document 2] Japanese Unexamined Patent Application Publication No. 2006-100531

For example, the Patent Document 1 discloses that a nonvolatile memory cell such as a ReRAM (resistance random access memory) is used as a device for achieving a neural network circuit.

The Patent Document 2 discloses a flash memory or an EEPROM (Electrically Erasable and Programmable Read Only Memory) as one example of the nonvolatile memory cells, and discloses a MONOS-type (Metal Oxide Nitride Oxide Semiconductor-type) memory cell.

SUMMARY

Figure 1:
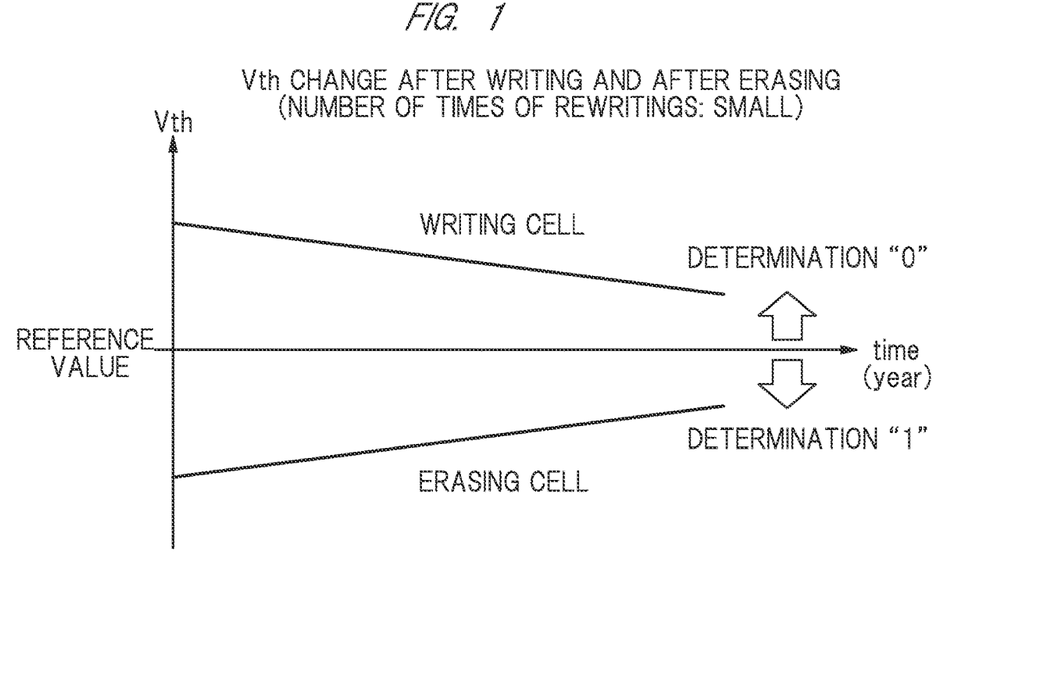
FIG. 1 is a graph showing change of a threshold voltage in a related art.

As shown in FIG. 1, in a reading operation of the nonvolatile memory cell, a state of the nonvolatile memory cell is determined to be "0" (a writing cell) when a threshold voltage Vth is higher than a reference value or to be "1" (an erasing cell) when the threshold voltage Vth lower than the reference value.

Figure 2:
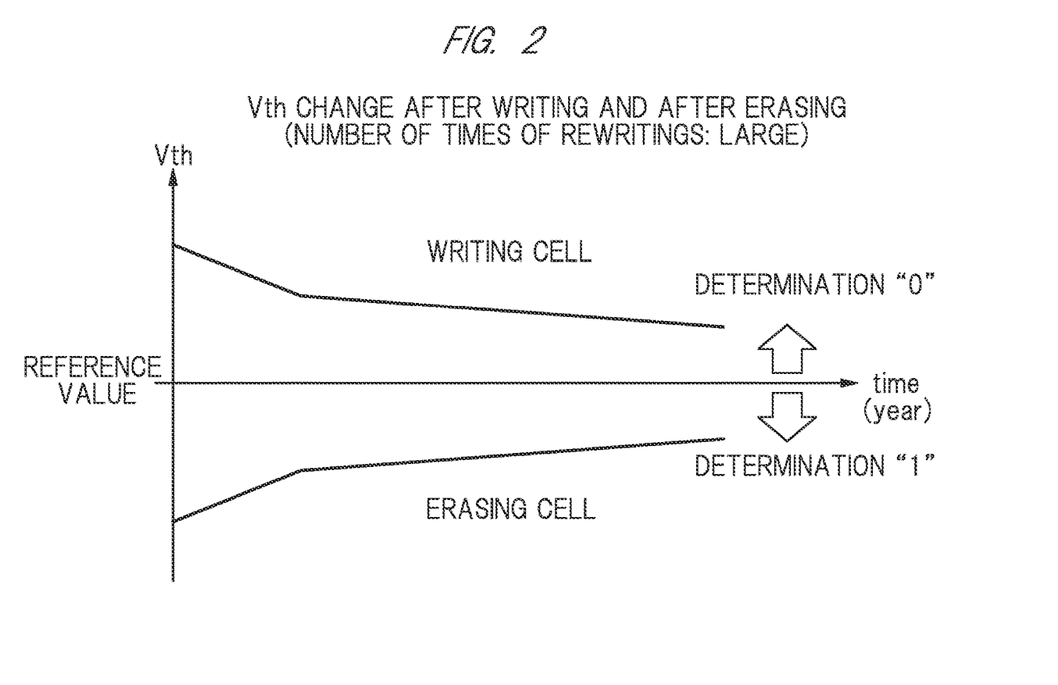
FIG. 2 is a graph showing change of a threshold voltage in a related art.

When the number of rewriting times on the nonvolatile memory cell is large as shown in FIG. 2, charge retention characteristics of the nonvolatile memory cell are deteriorated, and therefore, the threshold voltage Vth gradually changes after the writing and the erasing.

In any way, the nonvolatile memory cell needs to store the information in a long period of time of, for example, 10 years or more so that the state of the writing cell is equal to or higher than the reference value while the state of the erasing cell is equal to or lower than the reference value. In other words, a technique capable of accurately reading out the information recorded in the nonvolatile memory cell is needed. And, such a performance is also needed in the case of achieving the neural network circuit using the plurality of nonvolatile memory cells.

Other objects and novel characteristics will be apparent from the description of the present specification and the accompanying drawings.

According to one embodiment, a semiconductor device includes: a plurality of nonvolatile memory cells; a plurality of reference-current cells; and a sense amplifier electrically connected to the plurality of nonvolatile memory cells and the plurality of reference-current cells and comparing an electric current flowing in each of the plurality of nonvolatile memory cells and an electric current flowing in each of the plurality of reference-current cells. In this case, each cross-sectional structure of the plurality of reference-current cells is the same as each cross-sectional structure of the plurality of nonvolatile memory cells, and the writing operation or the erasing operation is also performed to each of the plurality of reference current memory cells when the writing operation or the erasing operation is performed to each of the plurality of nonvolatile memory cells.

According to one embodiment, when a neural network circuit is achieved by using a plurality of nonvolatile memory cells, a technique capable of accurately reading out information recorded in the plurality of nonvolatile memory cells can be provided.

DETAILED DESCRIPTION

Embodiments will be described in detail below on the basis of the drawings. In all the drawing for use in describing the embodiments, the elements having the same function are denoted with the same reference symbols, and the repetitive description thereof will be omitted. In addition, the description of the same or similar portions is not repeated in principle unless otherwise particularly required in the following embodiments.

An "X" direction, a "Y" direction and a "Z" direction explained in the present application cross one another, and are orthogonal to one another. In the present application, the Z direction is explained as an up-and-down direction, a height direction or a thickness direction of certain structure. The expression of the "plan view" used in the present application means that a surface made of the X direction and the Y direction is viewed in the Z direction.

First Embodiment

Regarding Neural Network

A concept of a neural network will be explained below with reference to FIGS. 3 and 4. In the neural network, easiness of information transmission changes depending on joint strength (strength of connection) of synapse that becomes a joint portion in the information transmission.

Figure 3:
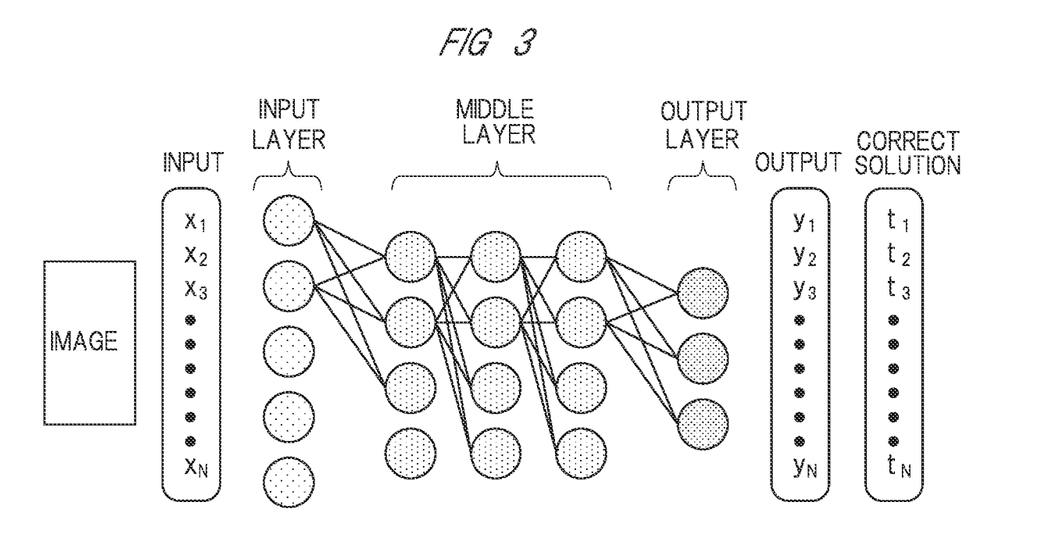
FIG. 3 is a conceptual diagram showing a neural network.
Figure 4:
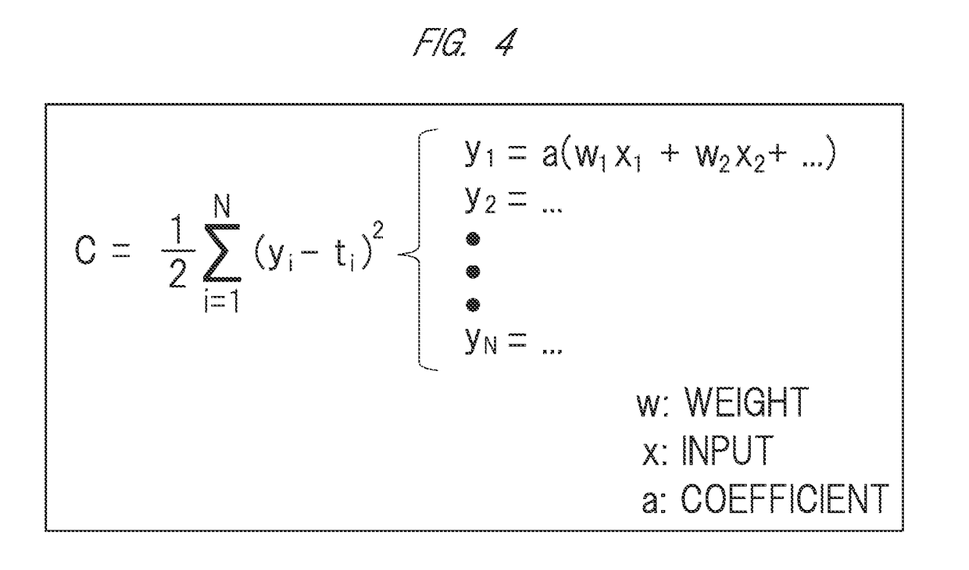
FIG. 4 is a diagram showing a mathematical expression used in the neural network.

As shown in FIG. 3, the neural network is made of an input layer, a middle layer and an output layer, and the joint strength of the synapse is represented by a weight "w" existing between the respective layers.

In order to observe an image of FIG. 3, a size of the input layer can be corresponded to the number of pixels, and an input "x" can be corresponded to an electric signal. And, it is known that a calculation for leading to an output "y" from the input "x" and the weight "w" can be represented by a mathematical expression shown in FIG. 4.

When the input "x" is input as a data from the image to the input layer, multiplication of the input "x" and the weight "w" is calculated as the output "y" in the output layer. The more a type of the weight "w" is, the more the number of the multiplications to be added is, and therefore, the more-detailed information is provided.

The middle layer is weighed by further multiplication of the weight "w" with the former multiplication (such as the multiplication of the input "x" and the weight "w" in the input layer). The more the middle layers are, the more the weighing is performed, and therefore, the output "y" has the still more-detailed information.

For example, when the image shows a monkey, various pieces of information are corresponded so that, for example, an output "y1" corresponds to information relating to mammalian, an output "y2" corresponds to information relating to a face shape, and an output "y3" corresponds to information relating to a hand shape, and the image can be made close to a correct solution.

And, the correct solution of the image is previously made to be a data as a correct solution "t". An error "C" can be provided from a difference between the output "y" and the correct solution "t". It can be said that the smaller a value of the error "C" is, the more correct the image data is. Therefore, the more the types of the input "x" and the weight "w" are, and besides, the more the type of the output "y" is, the more correct the image data is.

For example, when a neural network circuit C1 explained below is used, the input "x" can be corresponded to a signal of a control gate electrode CG, the weight "w" can be corresponded to a threshold voltage Vth of a nonvolatile memory cell MC, and the output "y" can be corresponded to an electric current value flowing in the nonvolatile memory cell MC (an electric current value flowing between a drain region and a source region).

Configurations of Semiconductor Chip CHP and Neural Network Circuit C1

Figure 5:
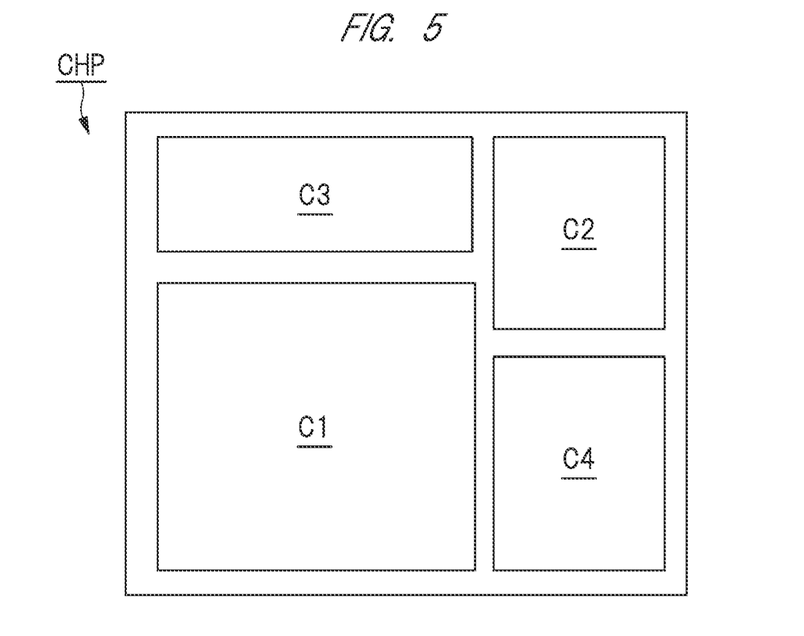
FIG. 5 is a plan view showing a layout of a semiconductor chip in a first embodiment.

FIG. 5 is a plan view showing a layout of a semiconductor chip CHP that is a semiconductor device of the first embodiment. The semiconductor chip CHP includes, for example, a neural network circuit C1, a ROM (Read Only Memory) circuit C2, a RAM (Random Access Memory) circuit C3 and a logic circuit C4. Although not illustrated here, an input/output circuit (I/O circuit), an analog circuit or others may be further provided to the semiconductor chip CHP.

The neural network circuit C1 is a region where an EEPROM is formed as a semiconductor element, and storage information of the EEPROM is electrically rewritable.

The ROM circuit C2 is a circuit where the storage information is not written but only read out. To the ROM circuit C2, an EEPROM having almost the same structure as that of the neural network circuit C1 is applicable as a semiconductor element.

The logic circuit C3 is a region serving as a semiconductor element which is driven at a low voltage of about 1.5 V and where a low-breakdown-voltage transistor having a low breakdown voltage and high speed operation is formed. For example, a CPU (Central Processing Unit) is made of the semiconductor element of the logic circuit C3.

The RAM circuit C4 is, for example, a SRAM (Static RAM) that is a region serving as a semiconductor element where a low-breakdown-voltage transistor having almost the same structure as that of the logic circuit C3 is formed.

Figure 6:
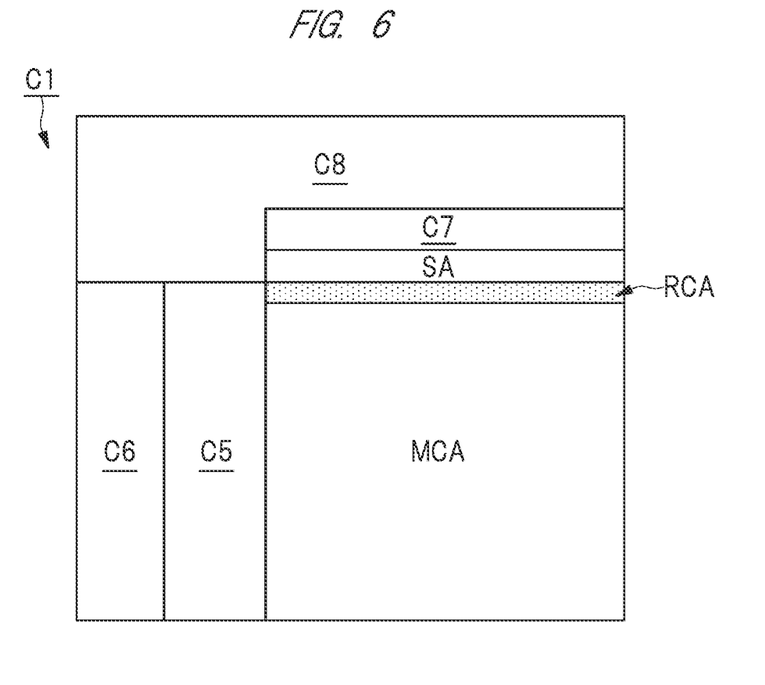
FIG. 6 a plan view showing a layout of a neural network circuit in the first embodiment.

FIG. 6 is a plan view showing a layout of the neural network circuit C1 shown in FIG. 5.

The neural network circuit C1 includes, for example, a memory cell array MCA, a reference-current cell array RCA, a sense amplifier SA, a word-line driver C5, an input/output unit C6, a bit-line selector C7 and a calculating circuit C8.

To the word-line driver C5, the input/output unit C6 supplies a voltage that is supplied from outside of the neural network circuit C1.

The word-line driver C5 is provided with a voltage boost circuit or others, and generates a necessary voltage for the writing operation, the erasing operation or the reading operation by using the voltage boost circuit. In each operation, an appropriate voltage of the respective generated voltages is supplied to the plurality of control gate electrodes CG, a plurality of memory gate electrodes MG or a plurality of source lines SL.

The bit-line selector C7 can select, via the bit line BL, the nonvolatile memory cell MC to be a target for the writing or the erasing of the storage information. The calculating circuit C8 can calculate the storage information.

The reference-current cell array RCA is arranged near the memory cell array MCA and the sense amplifier SA, and includes a plurality of reference-current cells RC.

The sense amplifier SA reads out the storage information of the selected nonvolatile memory cell MC through the bit line BL, and determines that the state of the nonvolatile memory cell MC is "0" (writing cell) or "1" (erasing cell) on the basis of the state of the threshold voltage Vth of the nonvolatile memory cell MC.

The sense amplifier SA is electrically connected to the memory cell array MCA (the plurality of nonvolatile memory cells MC) and the reference current cell array RCA (the plurality of reference-current cells RC). The sense amplifier SA can compare an electric current flowing in each of the plurality of nonvolatile memory cells MC and an electric current flowing in each of the plurality of reference-current cells RC.

Configuration of Nonvolatile Memory Cell MC

The nonvolatile memory cell MC of the first embodiment is an EEPROM, and is a MONOS-type memory cell. The plurality of nonvolatile memory cells MC are arranged in an array from to configure the memory cell array MCA.

Figure 7:
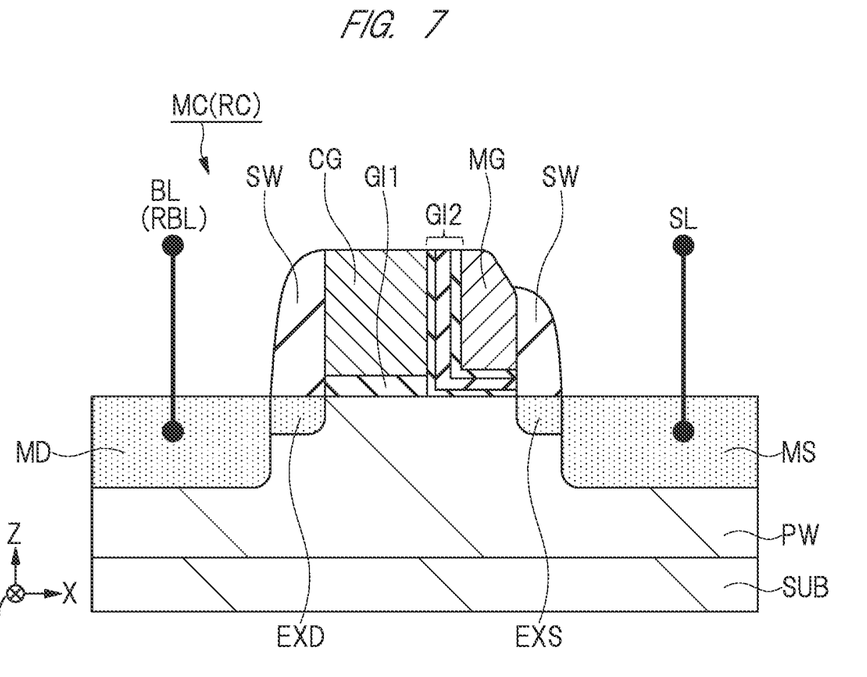
FIG. 7 is a cross-sectional view showing a nonvolatile memory cell in the first embodiment.

As shown in FIG. 7, each of the plurality of nonvolatile memory cells MC includes a gate dielectric film GI1, a gate dielectric film GI2 having a charge accumulating layer, a control gate electrode CG, a memory gate electrode MG, extension region EXD and diffusion region MD that are the drain region, and extension region EXS and diffusion region MS that are the source region.

In the first embodiment, a transistor including the gate dielectric film GI1 and the control gate electrode CG is referred to as a selection transistor while a transistor including the gate dielectric film GI2 and the memory gate electrode MG is referred to as a memory transistor in some cases.

A semiconductor substrate SUB is made of for example, a p-type silicon. In the semiconductor substrate SUB, a p-type well region PW is formed.

On the semiconductor substrate SUB, the gate dielectric film GI1 made of, for example, silicon oxide is formed. On the gate dielectric film GI1, the control gate electrode CG made of, for example, polycrystal silicon is formed.

The gate dielectric film GI2 is formed on the semiconductor substrate SUB and a side surface of the control gate electrode CG. On the gate dielectric film GI2, the memory gate electrode MG that is made of, for example, polycrystal silicon and is shaped to be a sidewall is formed. The control gate electrode CG and the memory gate electrode MG are adjacent to each other via the gate dielectric film GI2 in the X direction.

The gate dielectric film GI2 is made of, for example, a stacked film, and the stacked film is made of a silicon oxide film, a charge accumulating layer and a silicon oxide film. The charge accumulating layer is a film for accumulating the data of the memory cell MC, and is a dielectric film made of, for example, silicon nitride, having a trap level capable of storing the electric charge.

On each side surface of the control gate electrode CG and the memory gate electrode MG, a sidewall spacer SW made of a dielectric film such as a silicon nitride film is formed. An n-type extension region EXD and an n-type diffusion region MD are formed in a region of the semiconductor substrate SUB being close to the control gate electrode CG, and an n-type extension region EXS and an n-type diffusion region MS are formed in a region of the semiconductor substrate SUB being close to the memory gate electrode MG. Each of the diffusion region MD and the diffusion region MS has a higher impurity concentration than that of each of the extension region EXD and the extension region EXS, respectively.

The diffusion region MD is electrically connected to the bit line BL via a plug or others, and the diffusion region MS is electrically connected to the source line SL via a plug or others. The bit line BL is a wiring in, for example, the first layer, and the source line SL is a wiring in, for example, the second layer. Each wiring is made of a conductive film mainly made of an aluminum film or a copper film.

Each Operation of Nonvolatile Memory MC

Figure 8:
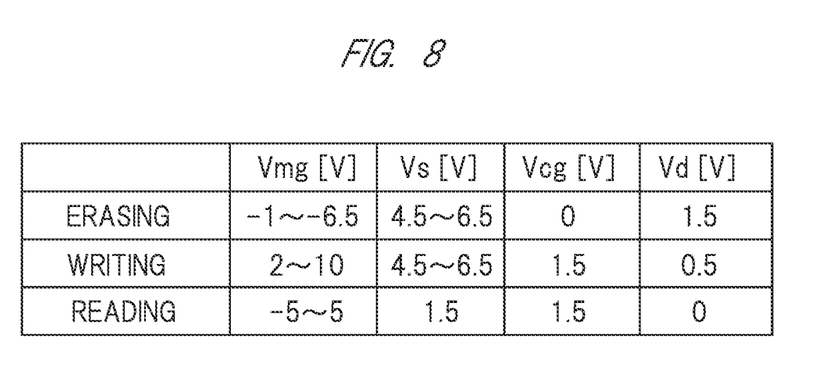
FIG. 8 is a diagram showing a voltage value in each operation of the nonvolatile memory cell in the first embodiment.

FIG. 8 shows each voltage value of the writing operation, the erasing operation and the reading operation on the nonvolatile memory cell MC. Each voltage is a voltage Vmg applied to the memory gate electrode MG, a voltage Vs applied to the diffusion region MS that is the source region, a voltage Vcg applied to the control gate electrode CG, and a voltage Vd applied to the diffusion region MD that is the drain region.

Note that the voltage values are only one example and are not limited to them, and are variously changeable if needed. In the first embodiment, injection of electrons into the charge accumulating layer in the gate dielectric film GF2 is defined to be the "writing" operation, and injection of holes (positive holes) into the charge accumulating layer in the gate dielectric film GF2 is defined to be the "erasing" operation.

To the writing operation, a so-called SSI (Source Side Injection) writing method of performing the writing operation by injection of hot electrons is applicable. In other words, the writing operation is performed by acceleration of the electrons from the drain region (the diffusion region MD and the extension region EXD) to the source region (the diffusion region MS and the extension region EXS) and injection of the accelerated electrons into the charge accumulating layer CSL. The injected electrons are trapped at the trap level in the charge accumulating layer, which results in increase in the threshold voltage Vth of the nonvolatile memory cell MC (memory transistor). In other words, the state of the nonvolatile memory cell MC becomes the writing state.

To the erasing operation, a so-called BTBT (Band-To-Band Tunneling phenomena) erasing method of performing the erasing operation by injection of hot holes is applicable. In other words, in the source region, the holes are injected into the charge accumulating layer by accelerating the holes generated by the BTBT phenomena, in the electric field. This manner decreases the threshold voltage Vth of the nonvolatile memory cell MC (memory transistor). In other words, the state of the nonvolatile memory cell MC becomes the erasing state.

In the reading operation, a value of the voltage Vmg is set between values of the threshold voltage Vth of the memory transistor in the writing state and the threshold voltage of the memory transistor in the erasing state. Therefore, when the sense amplifier SA reads out the value of the electric current flowing between the drain region and the source region, the charge accumulating state of the nonvolatile memory cell MC can be determined.

Each threshold voltage Vth of the plurality of nonvolatile memory cells MC (memory transistor) can be changed by a charge amount accumulated in the charge accumulating layer. The writing operation and the erasing operation for changing each threshold voltage Vth of the plurality of nonvolatile memory cells MC are individually performed to the plurality of nonvolatile memory cells MC.

In the first embodiment, values shown in FIG. 8 are used as the values of the voltage Vmg and the voltage Vs in the writing operation and the erasing operation. A voltage difference between the memory gate electrode MC and the source region can be made different between the writing operation and the erasing operation by appropriate combination of the values of the voltage Vmg and the voltage Vs.

Therefore, the plurality of nonvolatile memory cells MC having different threshold voltages Vth from one another can be prepared. Since the threshold voltages Vth of the plurality of nonvolatile memory cells MC are different from one another, the value of the electric current flowing in each of the plurality of nonvolatile memory cells MC is different for each of the plurality of nonvolatile memory cells MC in the reading operation on the plurality of nonvolatile memory cells MC.

In other words, in the first embodiment, values of the threshold voltages Vth of the plurality of nonvolatile memory cells MC are set to be a plurality of values, and the values of the electric currents flowing in the plurality of nonvolatile memory cells MC are also set to be a plurality of values.

According to the first embodiment, the input "x", the weight "w" and the output "y" that are explained with reference to FIGS. 3 and 4 can be corresponded to the signal of the control gate electrode CG, the threshold voltage Vth of the nonvolatile memory cell MC and the value of the electric current flowing in the nonvolatile memory cell MC (the value of the electric current flowing between the drain region and the source region), respectively. And, the joint strength of the synapse of the neural network circuit C1 can be achieved by the usage of the different electric current values. In this manner, the synapse of the neural network circuit C1 can be achieved by the usage of the plurality of nonvolatile memory cells MC of the first embodiment.

Problems of Study Example

Figure 9:
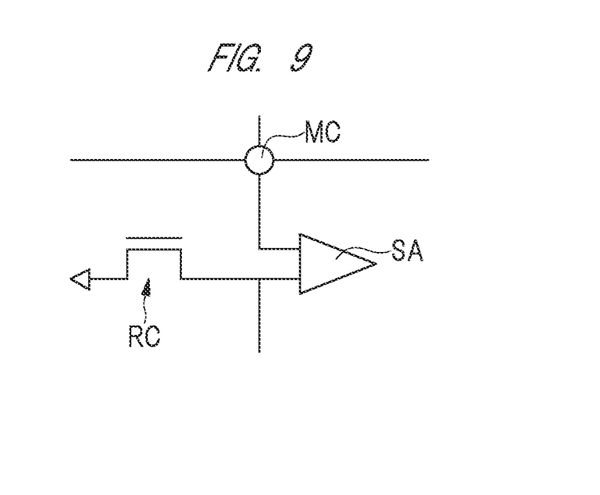
FIG. 9 is an equivalent circuit diagram showing a connecting relation among a nonvolatile memory cell, a sense amplifier and a reference-current cell in the first embodiment.

FIG. 9 is an equivalent circuit diagram showing a connection relation among the nonvolatile memory cell MC, the sense amplifier SA and the reference-current cell RC.

In the reading operation, a constant voltage Vref is applied to the gate electrode of the reference-current cell RC, and a constant reference electric current is supplied to the sense amplifier SA. The sense amplifier SA compares the value of the reference electric current of the reference-current cell RC and the value of the electric current flowing in the nonvolatile memory cell MC. Since the electric current flowing in the nonvolatile memory cell MC is small, the sense amplifier SA can amplify the value of the electric current flowing in the nonvolatile memory cell MC to be several times, and can compare the amplified value and the value of the reference electric current of the reference-current cell RC.

Figure 10:
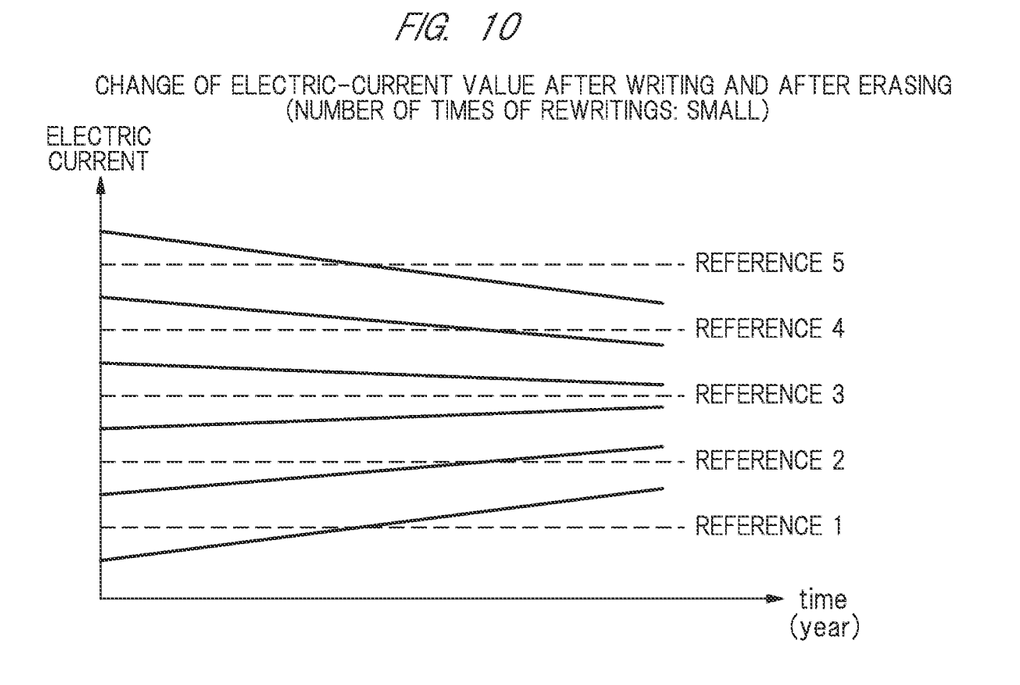
FIG. 10 is a graph showing change of an electric current value in a study example.

FIG. 10 is a graph showing change of the value of the electric current in the study example studied by the present inventors. A semiconductor element such as the low-breakdown-voltage transistor of the logic circuit C3 other than the nonvolatile memory cell. MC is generally applied to the semiconductor element configuring the reference-current cell RC.

In the first embodiment, the values of the electric current flowing in the plurality of nonvolatile memory cells MC are set to be a plurality of values, and therefore, it is necessary to prepare a plurality of reference-current cells RC corresponding to the values. In FIG. 10, for example, five reference-current cells RC are provided, and these reference-current cells RC generate reference electric currents 1 to 5 having different values from one another.

However, as shown in FIG. 10, usage of the nonvolatile memory cell MC in a long period of time deteriorates the charge retention characteristics of the nonvolatile memory cell MC. Since an interval between the electric-current values that are set to be a plurality of values is small, the reference electric currents 1 to 5 exceed the intervals, and therefore, there is a problem of erroneous determination of the sense amplifier SA.

Figure 11:
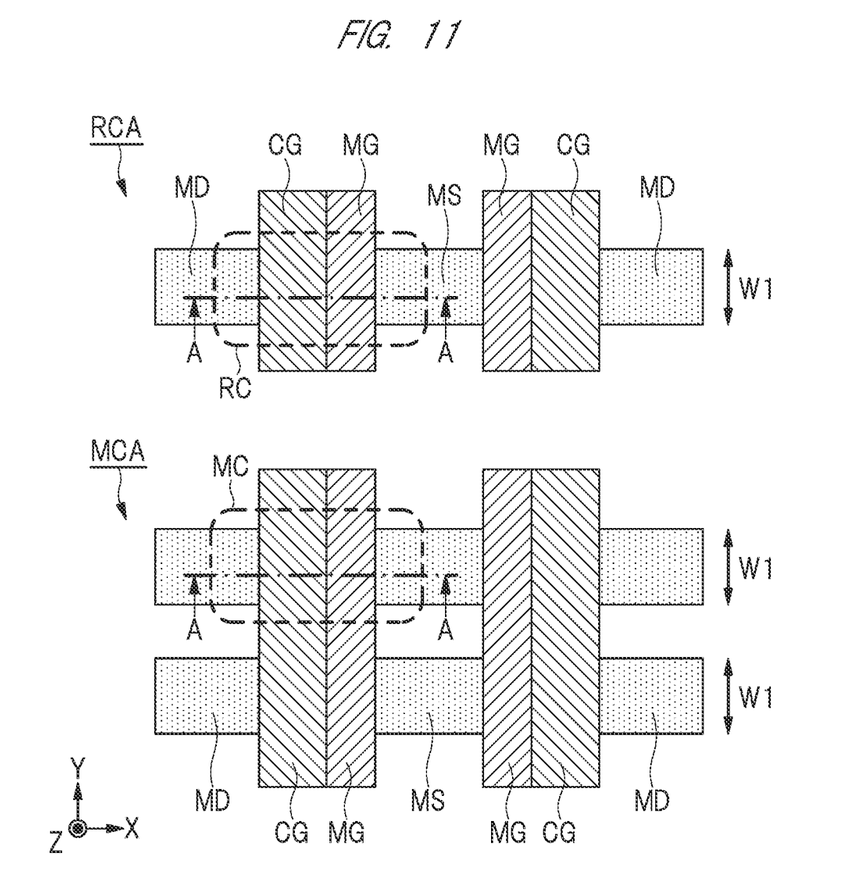
FIG. 11 is a plan view showing a memory cell array and a reference-current cell array in the first embodiment.
Figure 12:
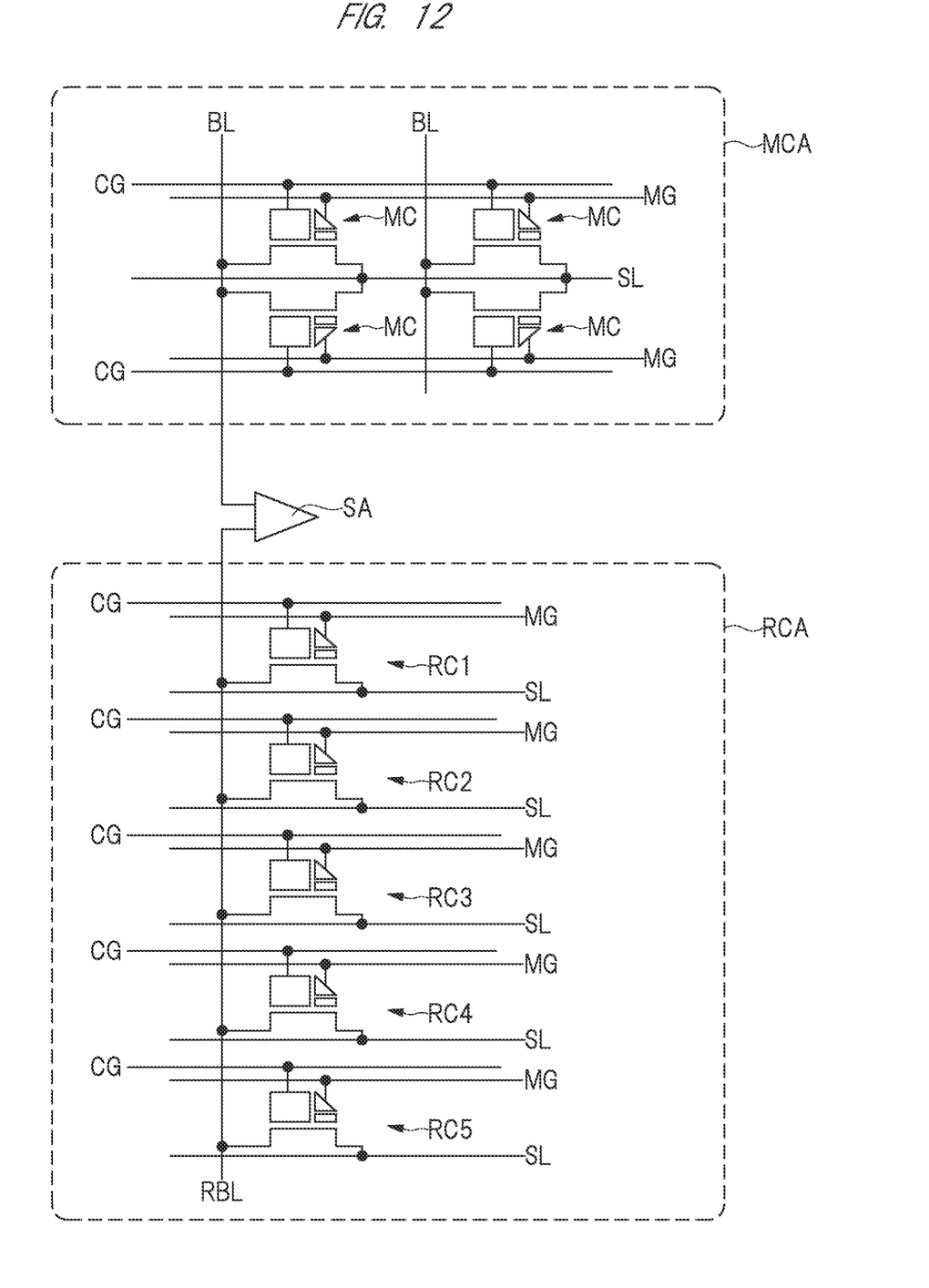
FIG. 12 is a circuit diagram showing a connecting relation among a nonvolatile memory cell, a sense amplifier and a reference-current cell in the first embodiment.

Reference-Current Cell Array RCA (Plurality of Reference-Current Cell RC) in First Embodiment FIG. 11 is a plan view showing the memory cell array MCA and the reference-current cell array RCA in the first embodiment, and FIG. 12 is a circuit diagram including these arrays and the sense amplifier SA. Note that a cross-sectional view taken along a line A-A of FIG. 11 corresponds to FIG. 7.

In the first embodiment, each cross-sectional structure of the plurality of reference-current cells RC and each cross-sectional structure of the plurality of nonvolatile memory cells MC are the same. In other words, each of the plurality of reference-current cells RC includes a gate dielectric film GI1, a gate dielectric film GI2 having a charge accumulating layer, a control gate electrode CG, a memory gate electrode MG, extension region EXD and diffusion region MD that are the drain region, and extension region EXE and diffusion region MS that are the source region.

As shown in FIG. 11, in the memory cell array MCA and the reference-current cell array RCA, a plurality of control gate electrodes CG and a plurality of memory gate electrodes MG extend in the Y direction. The Y direction is a gate-width direction of each of the control gate electrodes CG and the memory gate electrodes MG, and the X direction (a direction extending from the diffusion region MD to the diffusion region MS) is a gate-length direction of each of the control gate electrodes CG and the memory gate electrodes MG.

In the first embodiment, the reference-current cell RC and the nonvolatile memory cell MC are the same as each other in not only the cross-sectional structure but also a planar structure. In other words, each channel width W1 of the selection transistor and the memory transistor of the nonvolatile memory cell MC is the same as each channel width W1 of the selection transistor and the memory transistor of the reference-current cell RC. In still other words, the width W1 of the semiconductor substrate SUB in the Y direction under each of the control gate electrodes CG and the memory gate electrodes MG of the nonvolatile memory cell MC is the same as the width W1 of the semiconductor substrate SUB in the Y direction under each of the control gate electrodes CG and the memory gate electrodes MG of the reference-current cell RC.

In the first embodiment, the plurality of reference-current cells RC are formed in the same step of manufacturing the plurality of nonvolatile memory cells MC, and are formed near an end of the memory cell array MCA.

As shown in FIG. 12, the plurality of nonvolatile memory cells MC are electrically connected to the sense amplifier SA via each of the diffusion region MD and the bit line BL, and the plurality of reference-current cells RC (RC1 to RC5) are electrically connected to the sense amplifier SA via each of the diffusion region MD and the bit line RBL.

When the writing operation or the erasing operation is performed to each of the plurality of nonvolatile memory cells MC, the writing operation or the erasing operation is also performed to each of the plurality of reference-current cells RC. In other words, at the time of the writing operation or the erasing operation, each voltage shown in FIG. 8 is applied to each of the plurality of reference-current cells RC.

Therefore, the writing operations and the erasing operations for changing the threshold voltages Vth of the plurality of reference-current cells RC are individually performed to the plurality of reference-current cells RC, respectively. Since the respective threshold voltages Vth of the plurality of reference-current cells RC are different from one another, the value of the electric current flowing in each of the plurality of reference-current cells RC is different for each of the plurality of reference-current cells RC at the time of the reading operations on the plurality of nonvolatile memory cells MC.

The deterioration of the charge retention characteristics of the nonvolatile memory cell MC causes the almost equal deterioration of the charge retention characteristics of the reference-current cell RC. Therefore, the changes of the threshold voltage Vth and the value of the electric current of the reference-current cell RC are almost the same as the changes of the threshold voltage Vth and the value of the electric current of the nonvolatile memory cell MC. Even in change in external environment of the semiconductor chip CHP such as change in an operation temperature, the same influence is applied on the reference-current cell RC and the nonvolatile memory cell MC.

Figure 13:
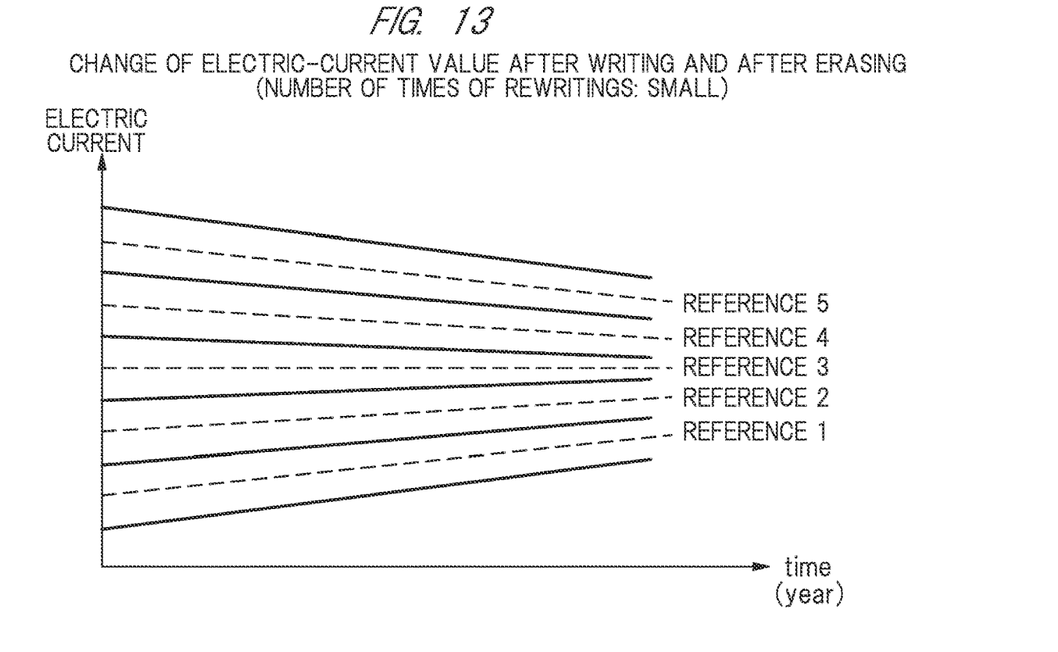
FIG. 13 is a graph showing change of an electric current value in the first embodiment.
Figure 14:
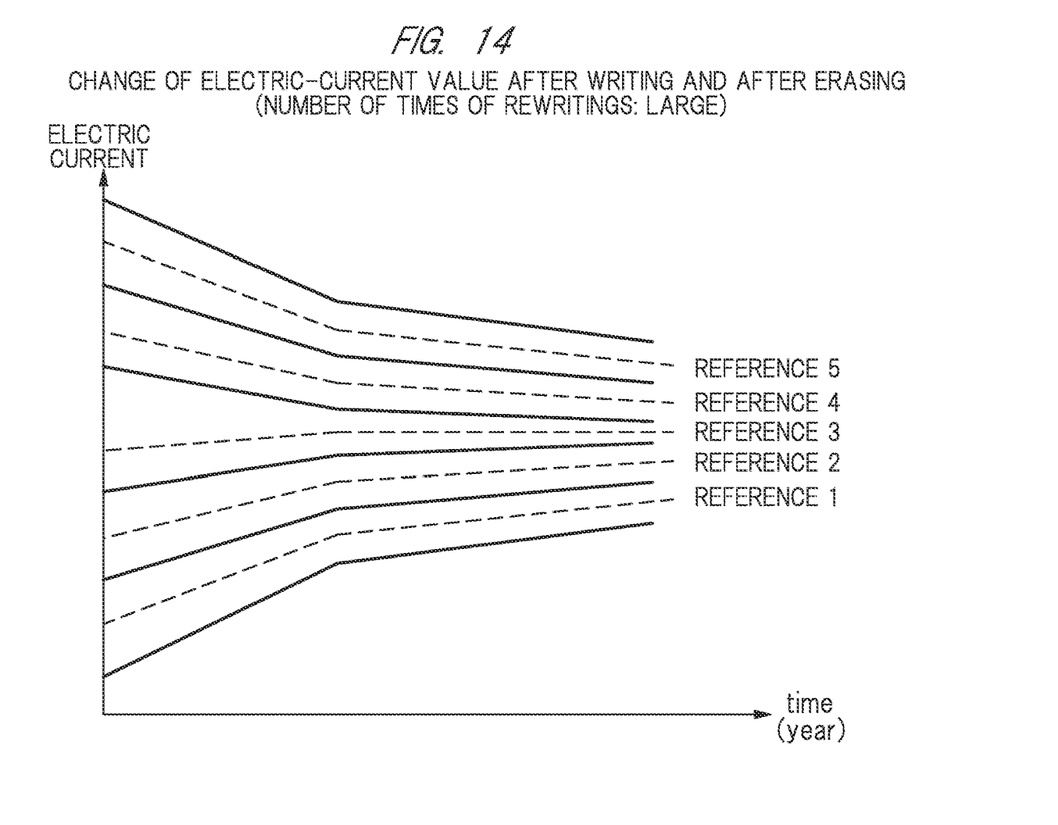
FIG. 14 is a graph showing change of an electric current value in the first embodiment.

Therefore, as shown in FIGS. 13 and 14, the values of the reference electric currents 1 to 5 flowing in the reference-current cells RC1 to RC5 are maintained between the electric current values that are set to be a plurality of values. Therefore, the problem of the erroneous determination of the sense amplifier SA as observed in the study example can be suppressed.

In other words, according to the first embodiment, when the neural network circuit C1 is achieved by usage of the plurality of nonvolatile memory cells MC, the information recorded in the plurality of nonvolatile memory cells MC can be accurately read out by usage of the reference-current cell RC.

In the first embodiment, note that the reference-current cells RC1 to RC5 are exemplified as the plurality of reference-current cells RC. However, the number of the plurality of reference-current cells RC can be appropriately increased or decreased depending on a degree of the plurality of the values of the electric currents flowing in each of the plurality of nonvolatile memory cells MC.

In the first embodiment, the MONOS-type memory cell including the dielectric film having the trap level as the charge accumulating layer is applied to the nonvolatile memory cell MC and the reference-current cell RC. The MONOS-type memory cell can generate the less defect bit and maintain the rewritable resistance in a longer period of time than other memory cells such as a resistive random access memory (ReRAM), a magnetoresistive random access memory (MRAM) and a ferroelectric random access memory (FeRAM). Therefore, the semiconductor device in the first embodiment can secure the reliability in a long period of time.

As shown in FIGS. 13 and 14, the MONOS-type memory cell can provide the stable change of the electric current, and therefore, it is easy to provide the stable weight "w". Therefore, it is easier to achieve the neural network circuit C1 than other memory cells.

Second Embodiment

Figure 15:
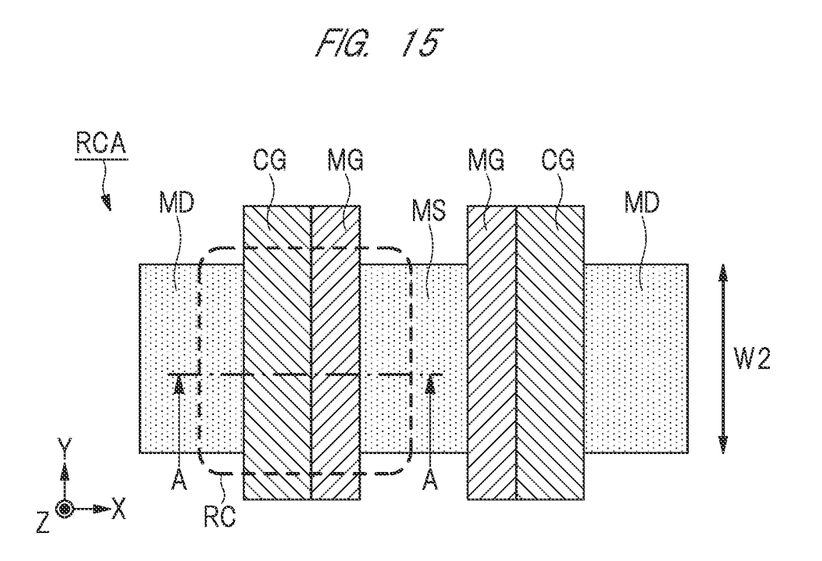
FIG. 15 is a plan view showing a reference-current cell array in a second embodiment.

With reference to FIG. 15, a semiconductor device in a second embodiment will be explained below. In the following explanation, note that difference points from the first embodiment will be mainly explained, and explanation for overlapping points with the first embodiment will be omitted.

In the first embodiment, the reference-current cell RC and the nonvolatile memory cell MC are the same in not only the cross-sectional structure but also the planar structure. In the second embodiment, the cross-sectional structure of the reference-current cell RC is the same as that of the nonvolatile memory cell MC while the planar structure of the reference-current cell RC is different from that of the nonvolatile memory cell MC.

As shown in FIG. 15, each channel width W2 of the selection transistor and the memory transistor of the reference-current cell RC is larder than each channel width W1 of the selection transistor and the memory transistor of the nonvolatile memory cell MC. In other words, a width W2 of the semiconductor substrate SUB in the Y direction positioned under each of the control gate electrode CG and the memory gate electrode MG of the reference-current cell RC is larger than the width W1 of the semiconductor substrate SUB in the Y direction positioned under each of the control gate electrode CG and the memory gate electrode MG of the nonvolatile memory cell MC.

Therefore, in the second embodiment, the value of the reference electric current flowing in the reference-current cell RC is larger, and thus, the variation in the reference electric current can be suppressed in comparison to the first embodiment. Therefore, the information recorded in the plurality of nonvolatile memory cells MC can be more accurately read out.

Third Embodiment

Figure 16:
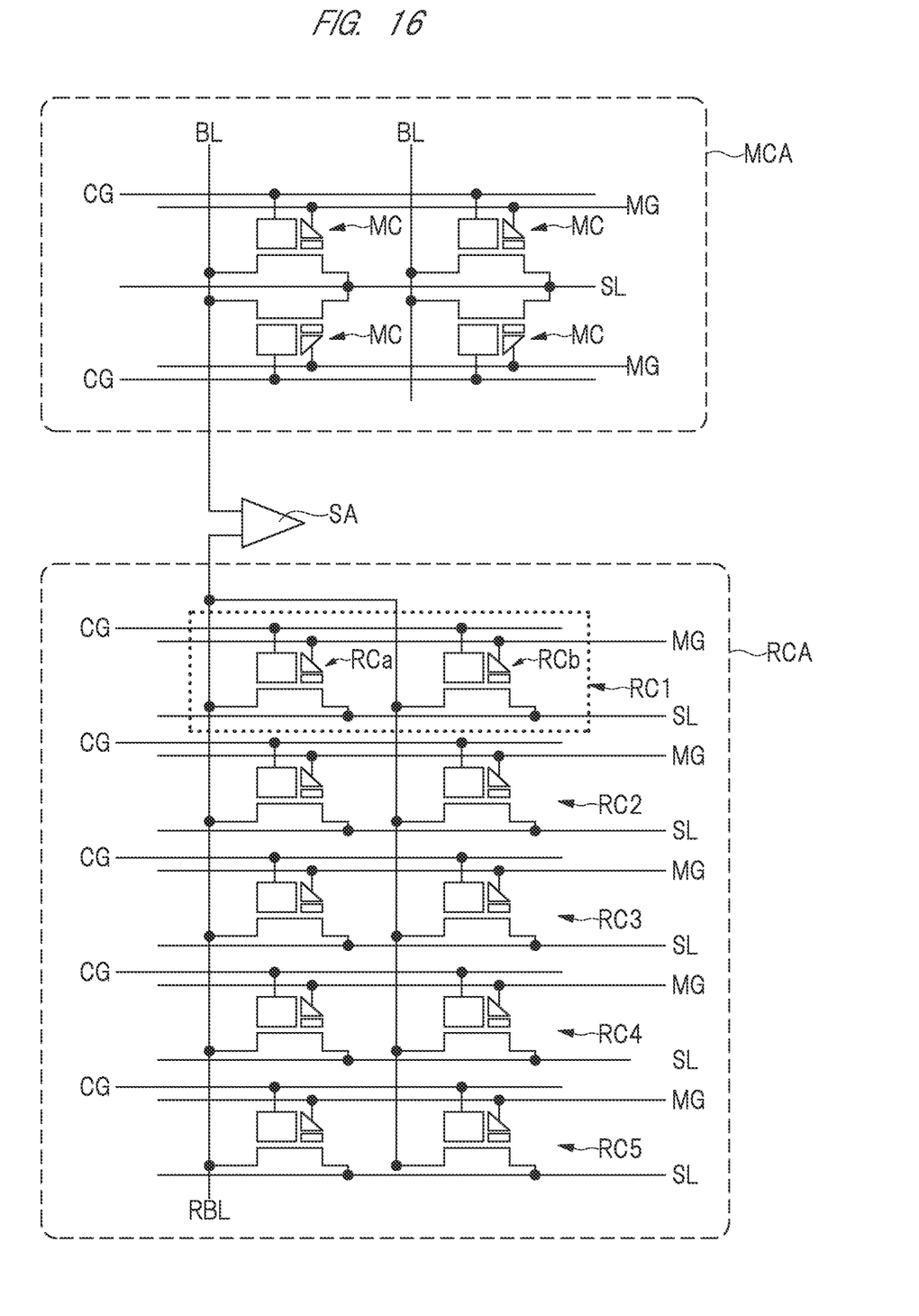
FIG. 16 is a circuit diagram showing a connecting relation among a nonvolatile memory cell, a sense amplifier and a reference-current cell in a third embodiment.

With reference to FIG. 16, a semiconductor device in a third embodiment will be explained below. In the following explanation, note that difference points from the first and second embodiments will be mainly explained, and explanation for overlapping points with the first and second embodiments will be omitted.

A purpose of the third embodiment is to increase the value of the reference electric current flowing in the reference-current cell RC as similar to the second embodiment. However, the purpose is achieved by a different method from that of the second embodiment.

The reference-current cell RC in the third embodiment is made of a plurality of reference-current elements, and is made of at least a reference-current element RCa and a reference-current element RCb.

The reference-current element RCa and the reference-current element RCb each has the same cross-sectional structure and planar structure as those of the reference-current cell RC in the first embodiment, and have a common control gate electrode CG, a common memory gate electrode MG, a common source line SL and a common bit line RBL.

In other words, each of the reference-current element RCa and the reference-current element RCb includes a gate dielectric film GI1, a gate dielectric film GI2, a control gate electrode CG, a memory gate electrode MG, a drain region (extension region EXD, diffusion region MD) and a source region (extension region EXS, diffusion region MS).

The control gate electrode CG of the reference-current element RCa is electrically connected to the control gate electrode CG of the reference-current element RCb, the memory gate electrode MG of the reference-current element RCa is electrically connected to the memory gate electrode MG of the reference-current element RCb, the drain region of the reference-current element RCa is electrically connected to the drain region of the reference-current element RCb, and the source region of the reference-current element RCa is electrically connected to the source region of the reference-current element RCb.

When the reference-current element RCa and the reference-current element RCb are wired to each other as described above, an effective channel width of the reference-current cell RC can be increased. Therefore, even in the third embodiment, the value of the reference electric current flowing in the reference-current cell RC is larger, and thus, the variation in the reference electric current can be suppressed in comparison to the first embodiment. Therefore, the information recorded in the plurality of nonvolatile memory cells MC can be accurately read out.

In the foregoing, the present invention has been concretely described on the basis of the embodiments. However, the present invention is not limited to the foregoing embodiments, and various modifications can be made within the scope of the present invention.

What is claimed is:

1. A semiconductor device comprising:
   a plurality of nonvolatile memory cells;
   a plurality of reference-current cells; and
   a sense amplifier electrically connected to the plurality of nonvolatile memory cells and the plurality of reference-current cells and comparing an electric current flowing in each of the plurality of nonvolatile memory cells and an electric current flowing in each of the plurality of reference-current cells,
   wherein each of the plurality of nonvolatile memory cells and the plurality of reference-current cells includes:
      a first gate dielectric film formed on a semiconductor substrate;
      a second gate dielectric film formed on the semiconductor substrate and having a charge accumulating layer;
      a first gate electrode formed on the first gate dielectric film;
      a second gate electrode formed on the second gate dielectric film;
      a drain region formed in a region of the semiconductor substrate close to the first gate electrode; and
      a source region formed in a region of the semiconductor substrate close to the second gate electrode,
   wherein a writing operation or an erasing operation is performed to each of the plurality of reference-current cells when the writing operation or the erasing operation is performed to each of the plurality of nonvolatile memory cells,
   wherein the first gate electrode and the second gate electrode of each of the plurality of nonvolatile memory cells and the plurality of reference-current cells extend in a first direction in a plan view, and are adjacent to each other in a second direction crossing the first direction in a plan view, and
   wherein a width of the semiconductor substrate in the first direction under each of the first gate electrode and the second gate electrode of the plurality of reference-current cells is larger than a width of the semiconductor substrate in the first direction under each of the first gate electrode and the second gate electrode of the plurality of nonvolatile memory cells.

2. The semiconductor device according to claim 1,
   wherein each of the plurality of reference-current cells is made of at least a first reference-current element and a second reference-current element,
   wherein each of the first reference-current element and the second reference-current element includes the first gate dielectric film, the second gate dielectric film, the first gate electrode, the second gate electrode, the drain region and the source region,
   wherein the first gate electrode of the first reference-current element is electrically connected to the first gate electrode of the second reference-current element,
   wherein the second gate electrode of the first reference-current element is electrically connected to the second gate electrode of the second reference-current element,
   wherein the drain region of the first reference-current element is electrically connected to the drain region of the second reference-current element, and
   wherein the source region of the first reference-current element is electrically connected to the source region of the second reference-current element.

3. The semiconductor device according to claim 1,
   wherein each of threshold voltages of the plurality of nonvolatile memory cells can be changed by a charge amount accumulated in the charge accumulating layer, and
   wherein, in the writing operation and the erasing operation on the plurality of nonvolatile memory cells, values of the threshold voltages of the plurality of nonvolatile memory cells are made different from one another by making difference in a voltage between the second gate electrode and the source region.

4. The semiconductor device according to claim 3, wherein, in a reading operation on the plurality of nonvolatile memory cells, values of electric currents flowing in the plurality of nonvolatile memory cells are made different among the plurality of nonvolatile memory cells.

5. The semiconductor device according to claim 4,
   wherein each of the plurality of nonvolatile memory cells and the plurality of reference-current cells configures a part of a neural network circuit, and
   wherein joint strength of a synapse is achieved by the different values of the electric currents flowing in the plurality of nonvolatile memory cells.

6. The semiconductor device according to claim 1,
   wherein the charge accumulating layer of each of the plurality of nonvolatile memory cells and the plurality of reference-current cells is made of silicon nitride,
   wherein, in the writing operation, electrons are injected from the drain region into the charge accumulating layer, and
   wherein, in the erasing operation, holes are injected from the source region into the charge accumulating layer.

* * * * *